United States Patent [19]

Rosenblum et al.

[11] Patent Number: 5,089,746
[45] Date of Patent: Feb. 18, 1992

[54] PRODUCTION OF ION BEAMS BY CHEMICALLY ENHANCED SPUTTERING OF SOLIDS

[75] Inventors: Stephen S. Rosenblum, Palo Alto; Kenneth J. Doniger, Menlo Park, both of Calif.

[73] Assignee: Varian Associates, Inc., Palo Alto, Calif.

[21] Appl. No.: 311,504

[22] Filed: Feb. 14, 1989

[51] Int. Cl.⁵ .................. C23C 14/48; H01J 27/02; H05H 1/00
[52] U.S. Cl. .................. 315/111.81; 315/111.21; 313/231.31; 250/423 R; 204/298.01; 204/298.04
[58] Field of Search .................. 315/111.21, 111.31, 315/111.81; 313/231.31; 250/423 R; 204/298.01, 298.04, 298.36, 192.34

[56] References Cited

U.S. PATENT DOCUMENTS

| | | | |
|---|---|---|---|
| 3,566,185 | 2/1971 | Gavin | 315/111 |
| 3,955,091 | 5/1976 | Robinson et al. | 250/423 R |
| 4,135,094 | 1/1979 | Hull | 250/427 |
| 4,344,019 | 8/1982 | Gavin et al. | 315/111.81 |
| 4,496,843 | 1/1985 | Kirita et al. | 250/403 R X |
| 4,529,475 | 7/1985 | Okano et al. | 204/192.34 X |
| 4,542,321 | 9/1985 | Singh et al. | 315/111.81 |
| 4,562,355 | 12/1985 | Keller et al. | 250/423 R |
| 4,563,610 | 1/1986 | Takagi et al. | 313/362.1 |
| 4,574,179 | 3/1986 | Masuzawa et al. | 315/111.81 X |
| 4,598,231 | 7/1986 | Matsuda et al. | 315/111.81 |
| 4,611,121 | 9/1986 | Miyamura et al. | 315/111.81 X |
| 4,629,548 | 12/1986 | Helmer | 204/298 |
| 4,633,084 | 12/1986 | Gruen et al. | 250/306 |
| 4,642,523 | 2/1987 | Nakanishi et al. | 315/111.81 |
| 4,649,278 | 3/1987 | Chutjian et al. | 315/111.81 X |
| 4,658,143 | 4/1987 | Tokiguchi et al. | 315/111.81 X |
| 4,703,180 | 10/1987 | Taya | 250/423 R X |
| 4,714,834 | 12/1987 | Shubaly | 315/111.81 X |
| 4,734,152 | 3/1988 | Geis et al. | 204/298.36 X |
| 4,774,414 | 9/1988 | Umemura et al. | 250/423 R |
| 4,774,437 | 9/1988 | Helmer et al. | 315/111.81 |
| 4,780,239 | 10/1988 | Snyder et al. | 204/192.34 X |
| 4,792,687 | 12/1988 | Mobley | 250/423 R |
| 4,795,529 | 1/1989 | Kawasaki et al. | 204/298.36 X |
| 4,847,476 | 7/1989 | Sato et al. | 250/423 R X |
| 4,873,445 | 10/1989 | Le Jeune | 250/423 R |
| 4,893,019 | 1/1990 | Oomori et al. | 315/111.81 X |

OTHER PUBLICATIONS

Sax, "Dangerous Properties of Industrial Materials", Van Nostrand Reinhold Company, p. 1, New York, 6th Ed., 1984.

Bai Gui Bin et al., "The Chemical Synthesis and Sputtering of Working Material in RF Heavy Ion Source," *Journal of Natural Science of Beijing Normal University*, No. 4 (1982), 29–33.

Bai Gui Bin et al., "The Difference Between Metal Ion Extracted from the R.F. Ion Source by Applyig Plasma Chemistry Action and by Non-Plasma Range Chemistry Range Reaction," *Proceedings of the 1987 IEEE Particle Accelerator Conference*, Mar. 16–19, Washington, D.C., pp. 354–357.

Ma Ming-Hsiu et al., "An Improved Radio Frequency Heavy Ion Source," *Radiation Effects*, 1979, vol. 44, pp. 207–212.

*Primary Examiner*—Eugene R. LaRoche
*Assistant Examiner*—Do Hyun Yoo
*Attorney, Agent, or Firm*—Peter J. Sgarbossa

[57] ABSTRACT

A method for producing an ion beam for ion implantation by chemically enhanced bombardment of solids. The method is carried out in a reaction chamber having an anode and cathode and a cathode liner rich in a selected element, namely boron, arsenic, phosphorus or antimony. A non-poisonous feed gas is introduced into the reaction chamber and energy is supplied to the feed gas to generate a plasma in the reaction chamber. The constituents of the plasma react chemically with the selected element in the cathode liner and an electrical potential is established between the anode and the cathode so that ions in the plasma bombard the cathode liner. The chemical reaction and bombardment together generate an ion species in the plasma containing the selected element. A beam of ions containing the selected species is then extracted from the plasma.

21 Claims, 3 Drawing Sheets

PRODUCTION OF ION BEAMS BY CHEMICALLY ENHANCED SPUTTERING OF SOLIDS

FIELD OF THE INVENTION

This invention relates to production of ion beams by chemically enhanced sputtering of solids and in particular, to production of boron, arsenic, phosphorous and antimony ions using non-poisonous feed gases and feed gases having at most low toxicity.

BACKGROUND OF THE INVENTION

In semiconductor processing of wafers using ion implantation, it is customary to "dope" the wafers using an ion beam consisting of a selected species of ion to impart desired electrical properties to the semiconductor wafer. Common ions used for this purpose are boron, arsenic, phosphorus and antimony.

In the prior art, two methods for producing beams of boron, arsenic and phosphorus are known. In one method, a poisonous or highly toxic feed gas is supplied from a pressurized gas supply to an ion source, where ions are created by plasma induced breakdown of the feed gas. Ions of the desired species are then extracted from the source and accelerated toward the target wafer using well known ion implantation apparatus. For example, boron ions are typically produced by flowing boron trifluoride ($BF_3$) into the source where ions are produced by plasma induced breakdown of the boron trifluoride. Arsenic atoms are typically produced using arsine ($AsH_3$) as the feed gas. Similarly, phosphorous ions are typically produced using phosphine ($PH_3$) as the feed gas. The gases supplied to the source are housed in a gas box containing three or four gas cylinders or bottles. In a typical three-gas manifold, source gases $BF_3$, $AsH_3$ and $PH_3$ are each contained in a separate gas cylinder in the gas box. Each cylinder is typically pressurized up to approximately 400 psi. Table 1 (from Section 1.2, Gas Bottle Charge Procedures Serial Process Ion Implantation Systems, Varian/Extrion Division, Glouster, Mass., Feb. 18, 1985) describes the physical characteristics and hazards of these commonly used implanter gases.

TABLE 1

PHYSICAL CHARACTERISTICS AND HAZARDS OF IMPLANTER GASES

| Smell | Gas | Characteristics | Hazards |
|---|---|---|---|
| Boron Trifluoride ($BF_3$) | Pungent and Suffocating | Colorless, heavier than air. Generates white fumes when exposed to air. Sharp, irritating odor in low concentration. | Toxic when inhaled. Severely corrosive to skin, eyes and mucous membranes. Skin contact with vapor liquid can cause serious burns. |
| Phosphine ($PH_3$) | Decaying Fish | Colorless, heavier than air. Gaseous at room temperature and atmospheric pressure. Minimum warning concentration 1.4 to 2.8 ppm (parts per million). Leave area immediately until clear. | Extremely toxic, highly flammable. Kidney, heart and brain appear particularly sensitive to $PH_3$ damage. |
| Arsine ($AsH_3$) | Garlic-like | Colorless, heavier than air. Gaseous at room temperature and atmospheric pressure. Difficult to detect by smell, despite distinctive odor. Leave area immediately if $AsH_3$ is suspected. | Extremely toxic, highly flammable. A nerve and blood poison. |

Boron trifluoride is designated as a hazardous material by the Department of Transportation (DOT) in the hazard class of non-flammable gas requiring the label non-flammable gas and poison (see 49 CFR §172.101). The Occupational Safety and Health Administration (OSHA) and the American Conference of Governmental Industrial Hygienists (ACGIH) have established a ceiling limit of 1 ppm for this gas. Arsine is designated by DOT as a hazardous material in the hazard class of Poison A requiring the labels poison gas and flammable gas (see 49 CFR §172.101). DOT defines a class A poison as a poisonous gas or liquid of such nature that a very small amount of the gas or vapor of the liquid, mixed with air is dangerous to life (see 49 CFR §173.326(a)). Both OSHA and ACGIH impose an exposure limit of 0.05 ppm for arsine. Arsine is highly toxic and may be fatal if inhaled. Phosphine is also classified by DOT as a hazardous material in the hazard class of Poison A requiring the labels poison gas and flammable gas (see 49 CFR, §172.101).

The handling of these hazardous and poisonous gases requires training and special safety precautions and special clothing and safety apparatus including self-contained breathing apparatus for those personnel who change or replace gas cylinders in the gas box of an ion implanter from time to time. For example, it is typically required for personnel transporting or handling $BF_3$ cylinders to wear a full-face shield or chemical safety glasses together with protective clothing that covers the entire body including chemically resistant gloves and clothed shoes. Personnel are also required to wear fire resistant garments when working with arsine and phosphine gases.

A second prior art method for producing boron, arsenic or phosphorous ions in ion implanters comprises simple thermal vaporization of these respective solid elements or a thermally induced chemical reaction such as the decomposition of lithium fluoroborate ($LiBF_4$) to liberate boron trifluoride. Solid arsenic is classified as a poison B by the DOT in 49 CFR, §172.101 and dry phosphorus is classified as a hazardous material in the hazard class of flammable solid requiring a label of a flammable solid and poison. The use of such solids reduces the amount of volatile poisonous vapors present in the system, but these oven type sources are troublesome to use. Typically, the plasma chamber and feed tubes must operate at high temperature to avoid plugging, typically at temperatures exceeding 700° C. This leads to enhanced corrosion. The control of temperature is the principal means for controlling the rate of feed of the arsenic, boron or phosphorus vapors and this feed mechanism has a long response time due to the thermal inertia of the oven, which leads to difficulties in controlling the vapor pressure.

Ion beams have also been produced by sputtering solid materials within the source. The use of physical sputtering to vaporize low pressure solids without chemical enhancement leads only to very low ion currents (less than 1 milliamp, see K. J. Hill and R. S. Nelson, Nuclear Instruments and Methods, Vol. 38, p. 15 (1965)) and so this type of source is not used in commercial semiconductor implanters. The work of Hill and Nelson has been confirmed by the applicants in the case of boron.

SUMMARY OF THE INVENTION

The present invention is a method for producing an ion beam for ion implantation by chemically enhanced bombardment of solids.

The method is carried out in a reaction chamber containing an anode and a cathode with a portion of the cathode being rich in a selected element, viz, boron, arsenic, phosphorus or antimony. A non-poisonous feed gas is introduced into the reaction chamber and energy is supplied to the feed gas in the chamber to generate a plasma. The constituents of the plasma react chemically with the selected element in the portion of the cathode which is rich in the selected element. An electrical potential is established between the anode and the cathode so that ions in the plasma bombard the portion of the cathode rich in the selected element.

As a result of the chemical reaction and the bombardment, an ion species containing the selected element is generated in the plasma. A beam of ions containing the selected species is then extracted from the plasma. The selected species is then separated from the beam to produce a beam containing the selected species for ion implantation.

When the selected element is boron, the feed gas comprises a fluorine containing compound which preferably does not contain chlorine.

When the selected element is arsenic or phosphorus, the feed gas comprises hydrogen or a compound containing fluorine, or a compound containing hydrogen. In this embodiment, good results may be obtained when the compound containing fluorine also contains chlorine.

When the selected element is antimony, the feed gas comprises a compound containing fluorine, or hydrogen, or a compound containing hydrogen. The compound containing fluorine preferably does not contain chlorine.

If desired, the feed gas may also contain small amounts of hydrogen, oxygen or argon.

In one embodiment the potential established between the anode and the cathode is independent of the energy supplied to the feed gas to generate the plasma, so that these variables may be independently controlled.

The invention may be further understood by reference to the drawings and the following detailed description.

DETAILED DESCRIPTION OF THE INVENTION

Figure 1:
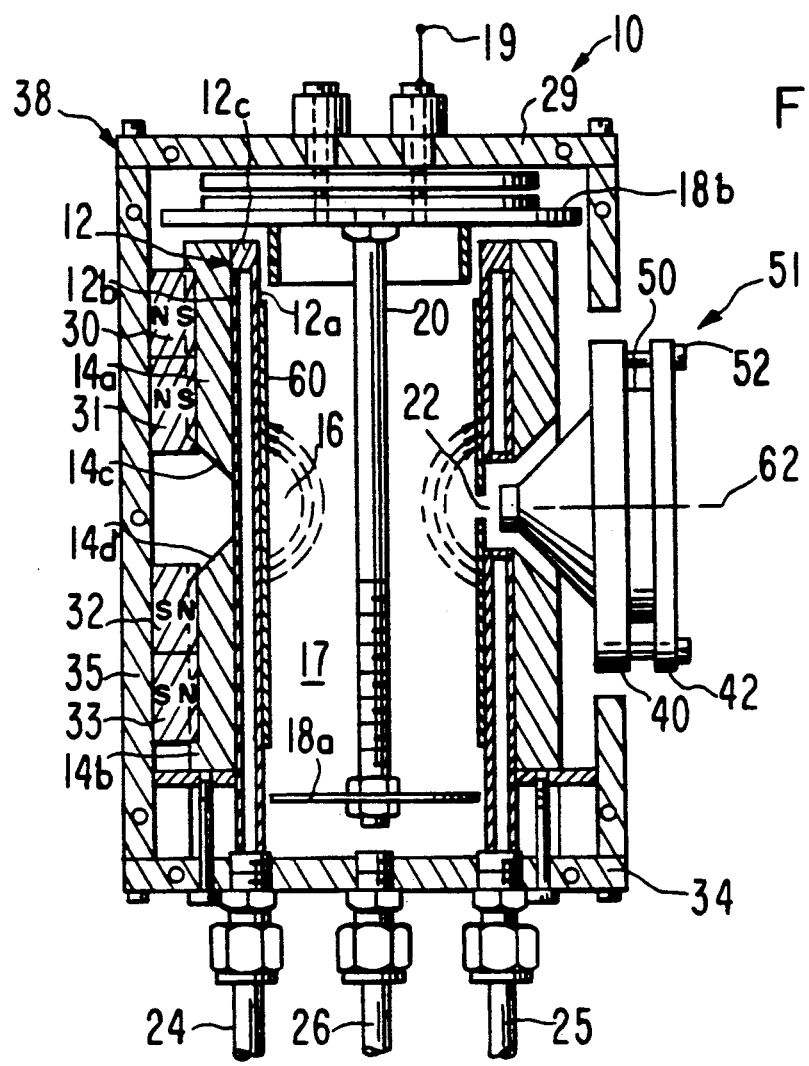
FIG. 1 shows a sectional side view of a cylindrical magnetron ion source for practicing the present invention.

FIG. 1 shows one embodiment of a cylindrical magnetron ion source for practicing the present invention. This ion source is described in detail in U.S. Pat. No. 4,774,437, assigned to the assignee of the present invention, which is incorporated herein by reference.

FIG. 1 is a sectional view from the side of cylindrical magnetron ion source 10. Ion source 10 includes axial anode 20 secured to circular anode end caps 18a and 18b. End cap 18b is bolted to end plate 29 of outer housing 38, but electrically isolated from it. Outer housing 38 includes opposed circular end plates 29 and 34, bolted to hollow cylindrical portion 35.

Cathode 12 includes inner cylinder 12a and outer cylinder 12b which are joined by annular ring 12c to form a double walled hollow jacket which is secured to end plate 34. Inlet 24 and outlet 25 permit cooling fluid, e.g. water, to be circulated through the hollow jacket of cathode 12. Cylindrical cathode liner 60 is secured to the central portion of the inner surface of inner cylinder 12a. Anode 20 extends along the axis of the cylindrical chamber region 17 within inner cylinder 12a.

Cylindrical polepieces 14a and 14b surround cathode 12 and each has a tapered end 14c and 14d, respectively, which define the gap between the polepieces. Permanent magnets 30 and 31, having the same polarity, are mounted between housing portion 35 and polepiece 14a. Permanent magnets 32 and 33, having the opposite polarity to magnets 30 and 31, are mounted between housing portion 35 and polepiece 14b. Housing 38 is made of magnetic material which forms a magnetic shield and serves as a yoke for the magnetic field produced by the permanent magnets.

In one embodiment, permanent magnets 30-33 and the shaped polepieces produce a magnetic field of about 200 gauss in the toroidal region 16 opposite the gap defined by polepieces 14a and 14b and within chamber 17. The dotted lines in region 16 approximately represent the lines of the magnetic field.

Figure 2:
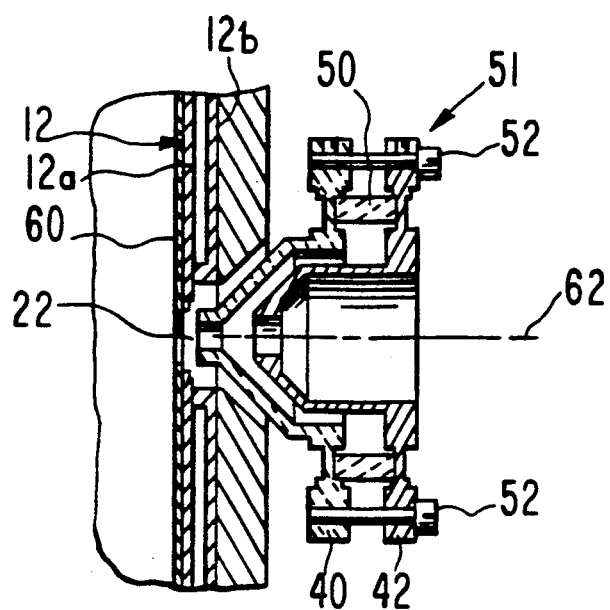
FIG. 2 shows a cross section of extraction apparatus 51 of the magnetron ion source shown in FIG. 1.

Anode terminal 19 is adapted for connection to a positive power supply of approximately 500 volts which produces a radial electric field between anode 20 and cathode 12. A feed gas is introduced into chamber 17 via gas inlet 26. In operation, when the feed gas is introduced and the DC voltage supply 102 (see FIG. 3) is connected, an intense donut-shaped discharge is generated in region 16. The magnetic field lines, which extend from the surface of the cathode in an arc that "re-enters" the cathode surface, confines the intense portion of the discharge to region 16. Positive ions generated in region 16 bombard the surface of liner 60 and primary electrons released by the bombardment flow to anode 20, but are substantially restrained by the magnetic field. Opening 22, which extends through cathode liner 60 and anode 20 permits extraction of ions 62 from region 16 by extraction apparatus 51 which extends through housing 38. As shown in FIG. 2, extraction apparatus 51 includes extractor electrode 40 which is formed of graphite and typically operated at ground potential in an ion implanter. Electrode 42, the suppressor electrode, which is formed of graphite is typically operated at −2 kV. Ceramic rings 50 and ceramic bolts 52 are used to space and hold the electrodes. Extraction apparatus 51 is supported by conventional means (not shown). The ion source 10 is typically floated at potentials greater than +30 kV, permitting the formation and propagation of an intense positive ion beam 62 (shown schematically in FIG. 2).

In operation, ions of several species are typically generated in region 16 and these several species are extracted by extraction apparatus 51. The extracted ion beam 62 is then separated using well known mass separation apparatus (not shown) to provide a beam of desired species which is then implanted into a semiconductor wafer.

Figure 3:
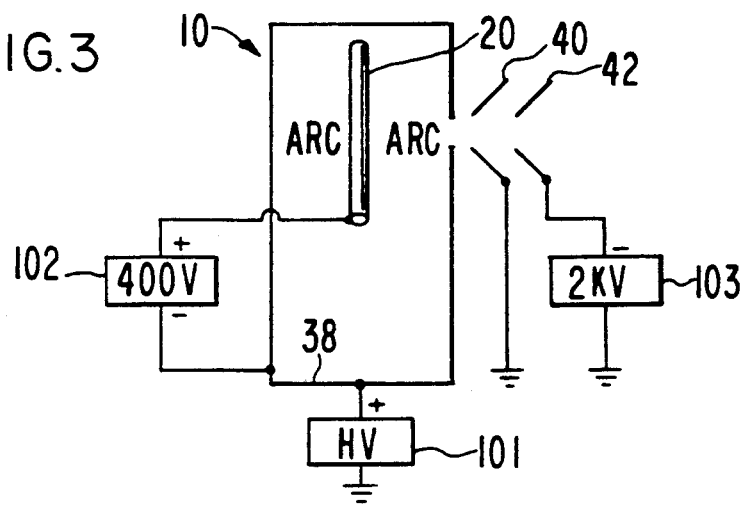
FIG. 3 shows an electrical schematic of the extraction apparatus of FIG. 2 and the magnetron ion source of FIG. 1.

FIG. 3 shows an electrical schematic of the extraction apparatus 51 and magnetron 10. Magnetron 10 floats at a potential provided by high voltage power supply 101 connected to housing 38. Power supply 102 provides the potential between anode 20 and cathode 12 to produce an arc discharge. Power supply 103 provides the electron suppressor voltage for suppressor electrode 42.

The above magnetron ion source has been used to produce boron ions $B^+$ by introducing non-toxic or low toxicity, non-poisonous feed gases into chamber 17 and using a boron containing cathode liner 60. In general, a liner rich in boron is employed, i.e. greater than 25% boron in atomic percentage, and preferably greater than 75% boron in atomic percentage. Materials used for cathode liner 60 include boron silicide (also called silicon hexaboride) and boron carbide. Other suitable cathode liners for producing boron ions include silicon tetraboride, barium hexaboride, calcium hexaboride, chromium boride ($Cr_2B$, $CrB$, $CrB_2$, $Cr_5B_3$), molybdenum boride ($Mo_2B$, $MoB$, $Mo_2B_5$), niobium diboride, strontium hexaboride, tantalum boride ($TaB$, $TaB_2$), thorium boride ($ThB_4$, $ThB_6$), titanium diboride, tungsten boride ($W_2B$, $WB$, $W_2B_5$), vanadium boride ($VB$, $VB_2$), zirconium boride ($ZrB_2$, $ZrB_{12}$), boron phosphide and rare-earth hexaborides. Using the magnetron source of FIG. 1, it is important that the liner have an electrical resistivity less than approximately 100 ohm-cm. Thus, a liner of pure boron cannot be used since pure boron has a much higher resistivity. It would be possible to use boron which is suitably doped, for example with copper or vanadium, so that it has a resistivity less than about 100 ohm-cm.

Table 2 below summarizes experimental results using boron silicide as a cathode liner and selected feed gases.

TABLE 2

| BORON SILICIDE LINER | |
|---|---|
| Feed Gas | $B^+$ Fraction |
| Carbon Tetrafluoride ($CF_4$) | 15% |
| Sulfur Hexafluoride ($SF_6$) | 16% |
| Dichloromethane ($CH_2Cl_2$) | 0.6% |
| Hydrogen ($H_2$) | less than 1% |
| Argon (Ar) | 0.2% |

It was found that the addition of hydrogen, oxygen and argon in small amounts (less than 10% by volume) to the feed gas $CF_4$, $SF_6$ or $CH_2Cl_2$ had no material effect on boron ion production.

An inspection of the above table shows that a good result, i.e. a boron fraction exceeding 15%, was obtained with boron silicide and a feed gas of carbon tetrafluoride or sulfur hexafluoride. The $B^+$ fraction was unsatisfactorily small (less than 1%) using a feed gas of dicloromethane, hydrogen or argon. The poor result using argon as the feed gas shows that physical sputtering alone of the liner is not sufficient to produce a good boron fraction.

A good result was also obtained using a boron carbide cathode liner and a feed gas of carbon tetrafluoride.

If the anode is made of the boron containing material and the cathode is stainless steel, a poor result is obtained for all feed gases. This shows that the production of a suitable fraction of boron ions is not a function of chemistry alone, but depends on the bombardment or sputtering of the boron-containing liner by the positive ions in the plasma.

The chemical and physical interactions in the plasma and between the plasma and the boron liner are complex and not fully understood. It is believed that the good results are obtained when the fluorine containing feed gas dissociates in the plasma and the fluorine reacts with the boron in the surface of the liner to form a volatile species, typically $BF_3$, which leaves the surface of the liner and dissociates and ionizes in the plasma, producing boron ions and other boron containing ion species. In addition to this chemical action, the positive ions in the plasma sputter the liner which produces mixing of material at the surface of the liner and desorption of the gaseous products which facilitates the chemical interaction. In any event, as noted above, the experiments demonstrate that chemical reactions between the plasma and the liner are alone not sufficient to provide good boron ion fractions and that the combination of chemical interaction and bombardment of the surface by charged ions in the plasma is required to produce high boron ion fractions.

Figure 4:
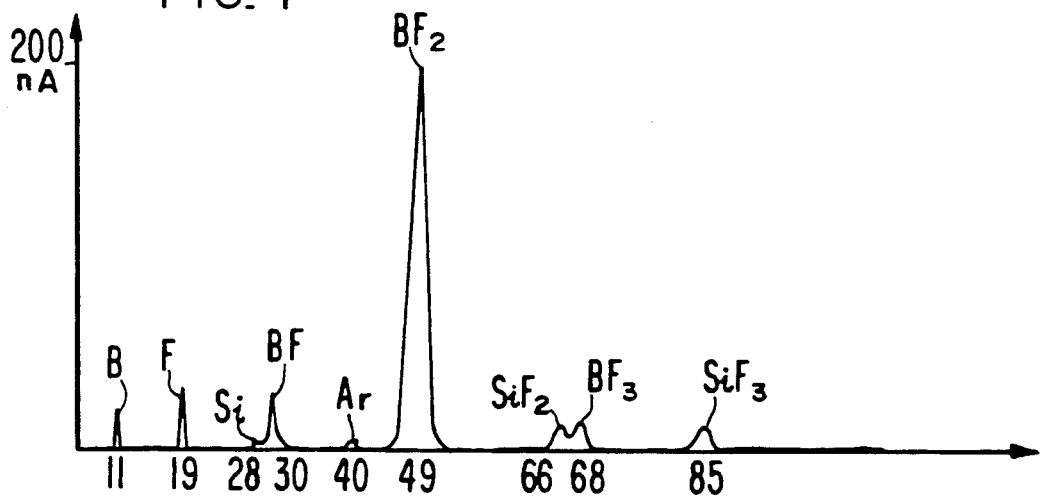
FIG. 4 shows a graph of a sample of ion currents of the ion species resulting from use of a $CF_4$ feed gas and a cathode liner of silicon hexaboride.

FIG. 4 shows a graph of a sample of ion species currents resulting from the use of the $CF_4$ feed gas flowing into chamber 17 at a rate of 0.57 sccm with a stainless steel anode and a cathode liner of silicon hexaboride. The arc (discharge) current is 0.6 Amp. The extracted current density was 15 milliamps/cm$^2$. In this embodiment, the boron fraction $B^+$ is approximately 7%. It should be noted that the fraction boron difluoride $(BF_2)^+$ is relatively high and this boron containing species may be used for shallow ion implants and, hence is regarded in certain applications as a desirable ion species.

Figure 5:
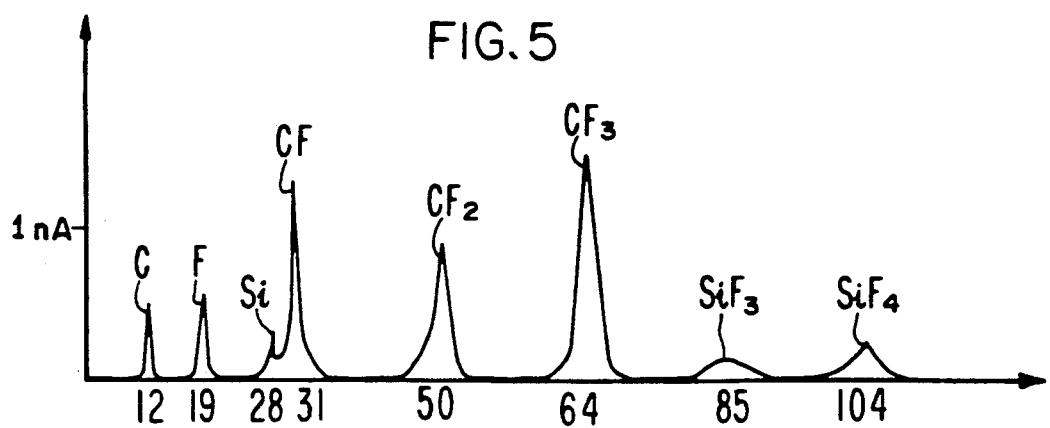
FIG. 5 shows a graph of a sample of ion currents of the ion species resulting from a feed gas of $CF_4$ using a titanium cathode liner and an anode of $B_4C$.

FIG. 5 shows a sample of the ion currents of various species using a titanium cathode liner, a $B_4C$ anode and the feed gas $CF_4$ flowing as the rate of 0.57 sccm and an arc current of 0.1 amps between the anode and the cathode. As may be seen, no boron ions species were produced which indicates that chemical reaction alone between a boron containing anode and the plasma is insufficient to produce desirable boron species.

Figure 6:
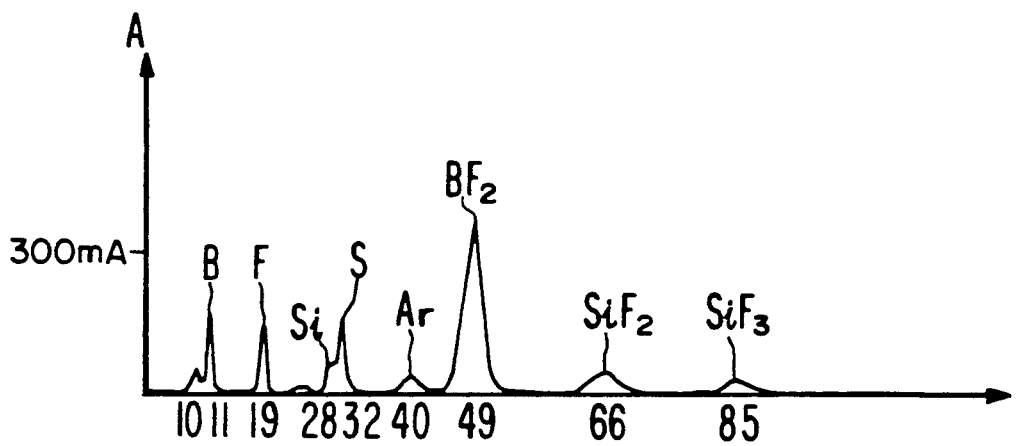
FIG. 6 shows a graph of a sample of ion currents of the ion species resulting from a feed gas of sulfur hexafluoride using a silicon hexaboride liner.

FIG. 6 shows a sample of the output ion species using a silicon hexaboride liner and a feed gas of sulfur hexafluoride flowing at 0.9 sccm plus 0.025 sccm of $O_2$. In this case, the boron fraction was 16% and the fraction of boron difluoride ($BF_2$) was approximately 34%.

Other feed gases that may be employed in addition to those described above include methyl fluoride ($CH_3F$), difluoroethane (Halocarbon 152A), trifluoromethane (Freon 23), hexafluoroethane (Freon 116), perfluoropropane, perfluoropropene, octafluorocyclobutane (Halocarbon C-318), and perfluorobenzene. It should be noted that of the above gases, carbon tetrafluoride is expected to be the most efficient gas since it is the most stable fluorocarbon with respect to attack by fluorine so that polymers are less likely to be formed.

Arsenic ions may be produced in the above apparatus by using a liner of elemental arsenic, zinc arsenide ($Zn_3As_2$), aluminum arsenide, gallium arsenide, indium arsenide, magnesium arsenide ($MgAs_4$), cadmium arsenide ($CdAs_4$, $Cd_3As_2$, $CdAs_2$) and alloys of the above. All of the above fluorocarbons suggested for use with boron may also be used as feed gases with the arsenic containing liners. In addition, hydrogen containing gases such as hydrogen, methane, ethane, ethylene, propane, and propene may be employed as feed gases with such arsenic containing liners. Hydrogen is desirable since arsenic reacts chemically with atomic hydrogen to produce the volatile species $AsH_3$. The following gases of at most low toxicity may also be used as a feed gas for producing arsenic: monochlorodifluoroethane (Fluorocarbon 142B), dichlorofluoromethane (Halocarbon 21), trichlorofluoromethane (Freon 11), dichlorodifluoromethane (Freon 12), trifluorochloromethane (Freon 13), difluoromonochloromethane (Freon 22), trifluorotrichloroethane (Freon 113), dichlorotetrafluoroethane (Freon 114), pentafluorochloroethane (Freon 115), and tetrafluoromonochloroethane.

Similarly, phosphorous ions may be produced using the above apparatus using the same feed gases as those used to produce arsenic ions, and liners of elemental black phosphorus, aluminum phosphide, magnesium phosphide ($MgP_4$), cadmium phosphide ($CdP_4$, $Cd_3P_2$), boron phosphide (BP), gallium phosphide (GaP), and indium phosphide (InP).

Ions of antimony may also be produced using the same feed gases used to produce boron ions, or the above-listed hydrogen containing gases, namely hydrogen, methane, ethane, ethylene, propane and propene, and liners of gallium antimonide (GaSb), aluminum antimonide (AlSb), indium antimonide (InSb) and zinc antimonide (ZnSb).

All of the gases employed in the invention are non-poisonous in the sense that they are not classified by DOT in 49 CFR §1,72.101 as a poison or as requiring a poison gas label. Non-poisonous is used in this sense herein. Moreover, the above gases, to the extent that data is available, also generally have no toxicity or are of at most low toxicity. The terms no toxicity and low toxicity as used herein are defined by Sax, Dangerous Properties of Industrial Materials, Van Nostrand Reinhold Company, page 1, NY (6th Ed., 1984), which is incorporated herein by reference. These gases are, of course, much less toxic than the boron trifluoride, arsine and phosphine typically employed in the prior art methods previously described.

In summary, a useful beam of boron ions may be derived from the above apparatus by (1) selecting a cathode liner that is rich in the boron atoms to be ionized;
(2) providing a feed gas containing a compound of fluorine, the feed gas being non-poisonous;
(3) establishing sufficient potential difference between the anode and cathode to generate a plasma discharge, the constituents of which react chemically with the boron in the liner to form a volatile species and the ions of which bombard the cathode liner;
(4) extracting a beam of ions including boron B+ ions from the plasma; and
(5) separating the B+ ions from the other ion species in the beam using known mass separation techniques.

If desired, a boron containing species such as $(BF_2)^+$ may be selected at step 5.

Arsenic or phosphorus ions are produced from the above apparatus by (1) selecting a cathode liner which is rich in the desired species (arsenic or phosphorus);
(2) providing a feed gas which includes a compound containing fluorine and chlorine, or a compound of fluorine not containing chlorine, or $H_2$, or a gas including a hydrogen compound, the feed gas being non-poisonous;
(3) establishing a sufficient potential difference between the anode and cathode to generate a plasma discharge, the constituents of which react chemically with the selected species in the surface of the liner to form a volatile species and the ions of which bombard the cathode liner;
(4) extracting a beam of ions including the desired species from the plasma; and
(5) separating the selected species from the other ions in the extracted beam using known mass separation techniques.

Antimony ions are produced by the method described above for the production of boron ions with "antimony" replacing "boron", except that in step (2), the feed gas may also be $H_2$, or a gas including a hydrogen compound which is of at most low toxicity. (In the prior art thermal vaporization method, solid antimony trifluoride is commonly used, which has high toxicity (see Sax, supra).)

While the method of producing a selected ion species from non-toxic or low-toxicity gases has been explained in conjunction with the cylindrical magnetron ion source shown in FIG. 1, the method is not limited to such a magnetron ion source.

Figure 7:
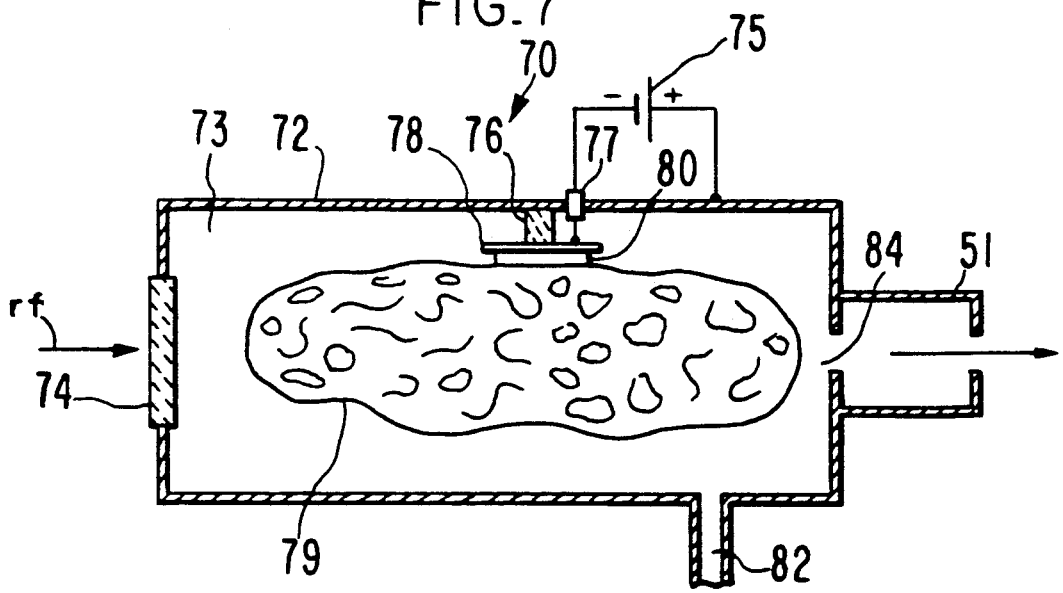
FIG. 7 shows a schematic diagram of a radio frequency resonator suitable for practicing the present invention.

FIG. 7 shows a schematic diagram of a radio frequency (rf) cavity or resonator 70 suitable for generating boron, phosphorus, arsenic or antimony ions. Rf cavity 70 includes a metal housing 72 which may be made, for example, of aluminum and a dielectric window 74 which may be made of quartz, alumina or beryllia or other dielectric transparent to the rf energy incident on the window from an rf power source (not shown). In another embodiment (not shown), housing 72 is lined with a refractory dielectric.

Gas feed line 82 supplies the desired feed gas to interior 73 of rf cavity 70. Rf cavity 70 also includes a conductive table 78 which is supported on an electrically insulating pedestal 76 made of any suitable dielectric. Table 78 is electrically connected to the negative terminal of DC power supply 75 via electrical feed through 77 in housing 72 and thus serves as a cathode. Housing 72 is electrically connected to the positive terminal of power supply 75 and acts as an anode.

Sample 80 on table 78 consists of any of the materials used for liner 60 in FIG. 1. The gas supplied to cavity 73 via gas inlet 82 is any one of the appropriate gases for the material of sample 80, as described above in conjunction with liner 60.

Slit 84 in housing 72 is provided for the extraction of ions via extraction apparatus 51, as explained in conjunction with extraction apparatus 51 shown in FIGS. 1-3.

In operation, the rf energy supplied via window 74 generates a plasma 79 in which the feed gas supplied via gas inlet 82 dissociates into species which react chemically with the desired element (e.g. boron, arsenic, phosphorus or antimony) in the sample to form a volatile species. The power supply 75 provides a negative potential to table 78 with respect to housing 72 in the range of 100 to 500 volts. This causes positive ions in the plasma to bombard or sputter the top surface of sample 80 and causes a mixing action at the surface of sample 80 which facilitates the chemical interaction with the desired element of the sample. The positive ion species in the plasma are extracted and the desired species separated as previously described. This embodiment provides the added degree of flexibility that the ion bombardment energy determined by power supply 75 is independent of the rf energy delivered to dissociate and ionize the plasma.

The above embodiments are intended to be exemplary and not limiting and many substitutions and modifications will be obvious to one of average skill in the art in view of the above disclosure.

We claim:

1. A method for producing an ion beam comprising a selected boron containing ion species for ion implantation, said method comprising:
    providing a reaction chamber having a first electrode and a second electrode, said first electrode having a portion rich in boron atoms;
    introducing a feed gas into said reaction chamber, said feed gas containing a compound of fluorine, said feed gas being non-poisonous;
    supplying energy to said feed gas in said reaction chamber sufficient to generate a plasma, the constituents of said plasma reacting chemically with said portion rich in boron atoms, and establishing an electrical potential between first electrode and said second electrode so that ions in said plasma bombard said portion, said boron containing ion species being produced in said plasma by said supplying and said establishing;
    extracting a first ion beam comprising said boron containing species from said plasma;
    and separating said boron containing ion species from said first ion beam to produce said ion beam comprising a selected boron containing ion species for ion implantation.

2. The method of claim 1 wherein said establishing an electrical potential is independent of said supplying energy to generate said plasma.

3. The method of claim 1 wherein said portion rich in boron atoms has an electrical resistivity less than 100 ohm-cm.

4. The method of claim 1 wherein said compound of fluorine does not contain chlorine.

5. The method of claim 1 wherein said non-poisonous feed gas has at most low toxicity.

6. The method of claim 1 wherein the atomic percentage of boron in said portion is greater than 75 percent.

7. The method of claim 1 wherein said feed gas comprises one or more of the following gases: Carbon Tetrafluoride ($CF_4$), Sulfur Hexafluoride ($SF_6$), difluoroethane, trifluoromethane, methyl fluoride, hexafluoroethane, perfluoropropane, perfluoropropene, octafluorocyclobutane, and perfluorobenzene.

8. A method for producing an ion beam comprising a selected arsenic containing or phosphorus containing ion species for ion implantation, said method comprising:
    providing a reaction chamber having a first electrode and a second electrode, said first electrode having a portion rich in arsenic or phosphorus;
    introducing a non-poisonous feed gas into said reaction chamber, said feed gas comprising a non-poisonous gas selected from the group consisting of a gas containing a compound of fluorine, hydrogen, and a gas containing a hydrogen compound;
    supplying energy to said feed gas in said reaction chamber sufficient to generate a plasma, the constituents of said plasma reacting chemically with said portion, and establishing an electrical potential between said first electrode and said second electrode so that ions in said plasma bombard said portion, said selected arsenic containing or phosphorus containing ion species being produced in said plasma by said supplying and said establishing;
    extracting a first ion beam containing said selected arsenic containing or phosphorus containing species from said plasma; and
    separating said selected arsenic containing or phosphorus containing species from said first ion beam to form said ion beam comprising a selected arsenic containing or phosphorus containing ion species for ion implantation.

9. The method of claim 8 wherein said establishing an electrical potential is independent of said supplying energy to generate said plasma.

10. The method of claim 8 wherein said portion has an electrical resistivity less than 100 ohm-cm.

11. The method of claim 8 wherein said compound of fluorine further includes chlorine.

12. The method of claim 8 wherein said non-poisonous feed gas has at most low toxicity.

13. The method of claim 8 wherein the atomic percentage of arsenic in said portion is greater than 75%.

14. The method of claim 8 wherein the atomic percentage of phosphorus in said portion is greater than 75%.

15. The method of claim 8 wherein said feed gas comprises one or more of the following gases: Carbon Tetrafluoride ($CF_4$), Sulfur Hexafluoride ($SF_6$), difluoroethane, trifluoromethane, methyl fluoride, hexafluoroethane, perfluoropropane, perfluoropropene, octafluorocyclobutane, perfluorobenzene, hydrogen, methane, ethane, ethylene, propane, propene, monochlorodifluoroethane, dichlorofluoromethane, trichlorofluoromethane, diclorodifluoromethane, trifluorochloromethane, difluoromonochloromethane, trifluorotrichloroethane, dichlorotetrafluoroethane, pentafluorochloroethane, and tetrafluoromonochloroethane.

16. A method for producing an ion beam comprising a selected antimony containing ion species for ion implantation, said method comprising:
    providing a reaction chamber having a first electrode and a second electrode, said first electrode having a portion rich in antimony atoms;
    introducing a feed gas into said chamber, said feed gas having at most low toxicity, said feed gas comprising one or more of the following gases:
    a gas containing a compound of fluorine, a gas containing hydrogen;
    supplying energy to said feed gas in said reaction chamber sufficient to generate a plasma, the constituents of said plasma reacting chemically with said portion, and establishing an electrical potential between said first electrode and said second electrode so that ions in said plasma bombard said portion, said selected antimony containing ion species being produced in said plasma by said supplying and said establishing;

extracting a first ion beam containing said selected antimony containing species from said plasma; and separating said selected antimony containing species from said first ion beam to form said ion beam comprising said selected antimony containing species for ion implantation.

17. The method of claim 16 wherein said compound of fluorine does not contain chlorine.

18. The method of claim 16 wherein said establishing an electrical potential is independent of supplying energy to generate said plasma.

19. The method of claim 16 wherein said portion has an electrical resistivity less than 100 ohm-cm.

20. The method of claim 16 wherein the atomic percentage of antimony in said portion is greater than 75%.

21. The method of claim 16 wherein said feed gas of at most low toxicity comprises one or more of the following gases: Carbon Tetrafluoride ($CF_4$), Sulfur Hexafluoride ($SF_6$), difluoroethane, trifluoromethane, hexafluoroethane, perfluoropropane, perfluoropropene, octafluorocyclobutane, perfluorobenzene, hydrogen, methane, ethane, ethylene, propane, and propene.

* * * * *